(12) United States Patent
Moshe et al.

(10) Patent No.: US 6,580,301 B2
(45) Date of Patent: Jun. 17, 2003

(54) METHOD AND APPARATUS FOR A CLOCK CIRCUIT

(75) Inventors: David Moshe, Tahanch (IL); Eyal Gutkind, Ramot Naftali (IL); Shmuel Dino, Beer Sheva (IL); Maksim Tozik, Beer Sheva (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/884,376

(22) Filed: Jun. 18, 2001

(65) Prior Publication Data

US 2002/0190772 A1 Dec. 19, 2002

(51) Int. Cl.[7] ................................................. H03H 11/16
(52) U.S. Cl. ........................ 327/256; 327/257; 327/237
(58) Field of Search ................................. 327/255, 231, 327/237, 250, 254, 256, 158, 257

(56) References Cited

U.S. PATENT DOCUMENTS

| | | | |
|---|---|---|---|
| 4,922,141 A | * 5/1990 | Lofgren et al. | 327/158 |
| 5,451,894 A | * 9/1995 | Guo | 327/241 |
| 5,845,109 A | * 12/1998 | Suzuki et al. | 395/552 |
| 6,265,918 B1 | * 7/2001 | Toda | 327/146 |
| 6,150,863 A1 | * 11/2002 | Conn et al. | 327/270 |

* cited by examiner

*Primary Examiner*—Dinh T. Le
(74) *Attorney, Agent, or Firm*—James L. Clingan, Jr.

(57) ABSTRACT

An additional clock is delayed from a master clock by 90 degrees to provide needed additional clock edges during a cycle. The need for the additional clock edges arises from the desire to perform a read and a write in the same clock cycle. The precise delay is achieved through a clock programmable delay that can be updated as the frequency of the master clock may change. The amount of delay is conveniently detected by using two other programmable delays to achieve a 180 degree delay. The 180 degree delay is easily detected using a flip-flop. The programming signal that caused the total of 180 degrees of delay caused 90 degrees per programmable delay. The same programming signal is then coupled to the clock programmable delay to achieve the desired 90 degrees of delay for the additional clock.

20 Claims, 2 Drawing Sheets

METHOD AND APPARATUS FOR A CLOCK CIRCUIT

FIELD OF THE INVENTION

This invention relates to clocks, and more particularly to clocks for providing synchronizing signals.

BACKGROUND OF THE INVENTION

Most integrated circuits are synchronous in operation and utilize at least one master clock and generate other clocks from that master clock. The generation of multiple clocks is for different purposes and different locations. The differing functions of the integrated circuit have different clocks for the particular purpose. For a processing system it is desirable that each cycle of the clock, a variety of options are available, such as performing any of the instructions in the instruction set of the processing system. The speed of the clock, while it is desirable that it be fast, must be slow enough to allow all of the operations necessary to complete an instruction to be completed. Some of the operations that are needed or are desirable relate to getting as many things done as possible in a single clock cycle. In order to do this, there must the needed clocks to achieve these results. One technique has been to double the clock frequency in order to provide the clocking necessary for these operations.

One disadvantage of this double frequency approach is that the need to provide a phase locked loop for it. The phase locked loop itself generally requires a voltage controlled oscillator (VCO). For proper operation, there is significant design resources and space on the integrated circuit that are required. The result is a time-consuming and space consuming approach.

Thus, there is a need for providing a clocking mechanism for operations during a cycle that does not require doubling the frequency with a phased locked loop.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

Described herein is a technique that provides a way to operate a memory during a single cycle of a system clock. A second clock is generated that is substantially 90 degrees out of phase with the master clock. This provides clock edges that are half way between the clock edges of the master clock. The additional clock edges provide for the benefit of enabling a memory to be written into and read out of in a single cycle.

Figure 1:
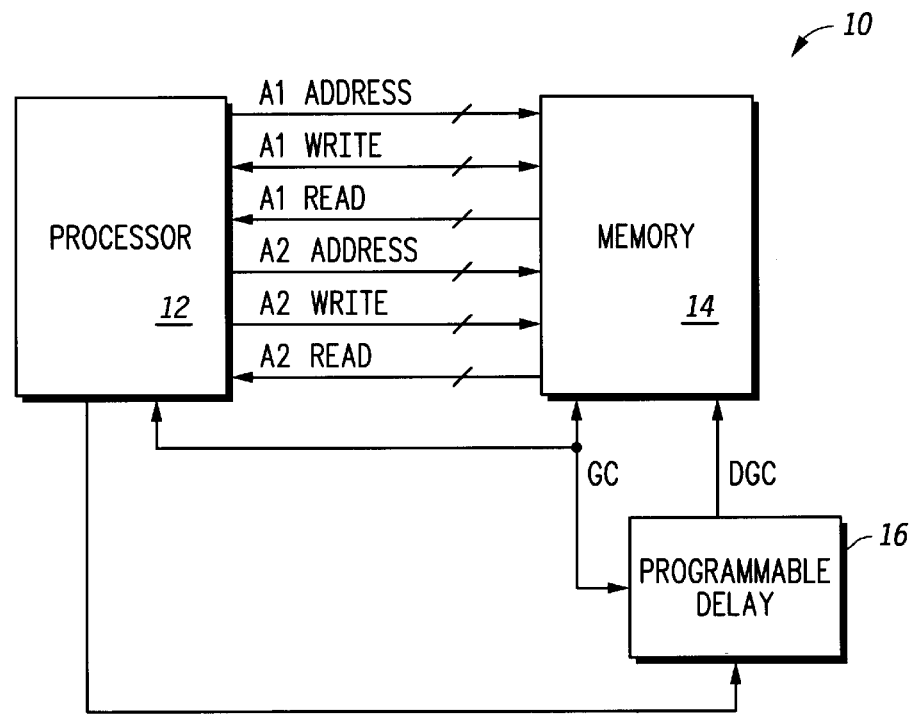
FIG. 1 is a block diagram of processing system according to an embodiment of the invention.

Shown in FIG. 1 is a processing system 10 comprising a processor 12, a memory 14, and a programmable delay 16. Processor 12 operates according to the timing provided by global clock GC. Memory 14 is coupled to processor 12 by two sets of buses A1 and A2. Each set of buses has a read bus, a write bus, and an address bus. Memory 14 operates according to the timing provided by global clock GC and delayed global clock DGC. Programmable delay 16 provides delayed global clock DGC at the same frequency as global clock GC and a delay that is substantially 90 degrees.

Figure 2:
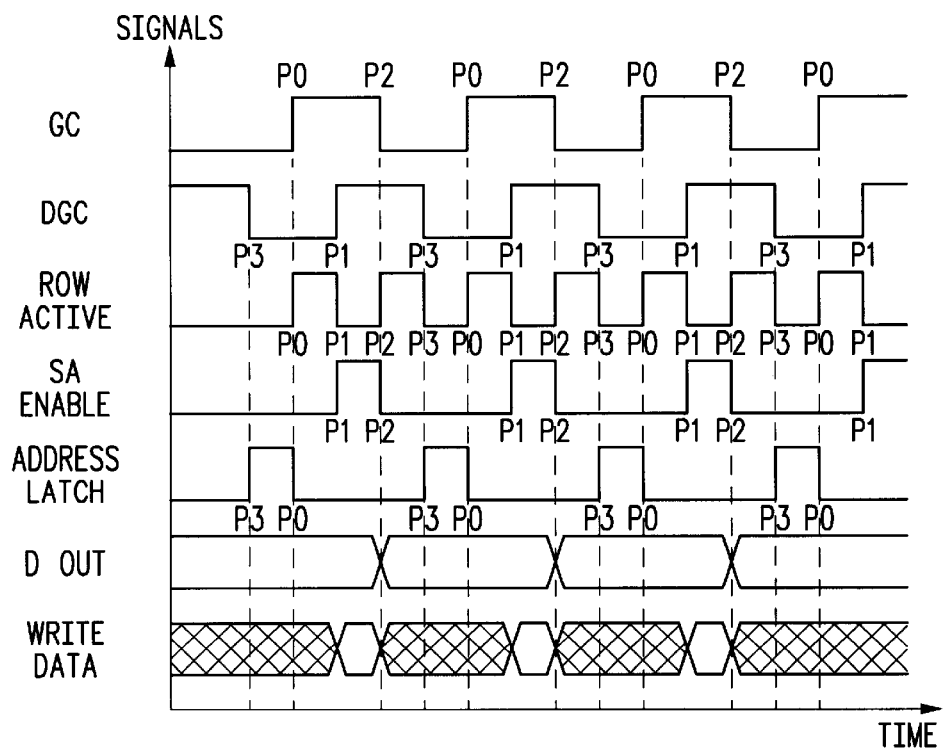
FIG. 2 is a timing diagram helpful in understanding the operation of the processing system of FIG. 1.

Shown in FIG. 2 is a timing diagram that shows some functional operations based on the clock edges of clocks GC and DGC. The beginning of a clock cycle is considered to occur on a rising edge of the global clock GC and terminate on the next rising edge, which also designates the beginning of the next clock cycle. The falling edge of the global clock GC is the middle of the clock cycle. The global clock GC desirably has a 50% duty cycle. The delayed global clock has its rising edge at about 25% of the cycle and its falling edge at about 75% of the cycle. This way, as shown in FIG. 2, each cycle can be considered to have four clock edges start at with P0 at the rising edge of global clock GC, and continuing with P1, P2, and P3 at the rising clock edge of delayed clock DGC, the falling edge of global clock GC, and falling edge of delayed global clock DGC, respectively.

In operation, it may be desirable for processor 12 to perform a read and a write. For the case in which the address is known for both read and write and the data is known for the write, there is an opportunity to perform both the read and the write in the same cycle to enhance the speed of operation. For such a case, processor 12 provides the addresses on address busses A1 and A2 prior to the beginning of the cycle. The addresses are latched between P3 and P0 and maintained until the next occurrence of P3. At the beginning of the cycle P0, one row of memory 14 is enabled as selected by the address on address bus A1, assuming set of buses A1 is for reading in this case. Sense amplifiers inside memory 14 are enabled at P2 so that the data to be read is then available and clocked out at P2 onto the A1 data bus. The data is held valid until the next occurrence of P2. Also at P2, another row is accessed according to the address on address bus A2 and the write data is sampled on write bus A2. The write data must be valid at least a short setup time prior to P2. At P3, the next addresses are latched to be ready for the beginning of the next cycle at P0.

This capability is beneficial for providing a high speed of operation. This provides for read and a write to be performed in a single cycle. Similarly, two reads or two writes can be performed in the same cycle using the two sets of buses A1 and A2 in combination with the global clock GC and delayed global clock DGC Processor 12 maintains delayed global clock at substantially a 90 degree delay by continually updating the delay of programmable delay 16. If there is a change in frequency to global clock GC, processor 12 responds by adjusting the delay of programmable delay 16. The delay is updated every 128 cycles of global clock GC. The number of cycles is a choice that can be made smaller or larger. There may be a limit on how much smaller the number may be because there may be a number of cycles required before the change in frequency can be accurately quantified.

Figure 3:
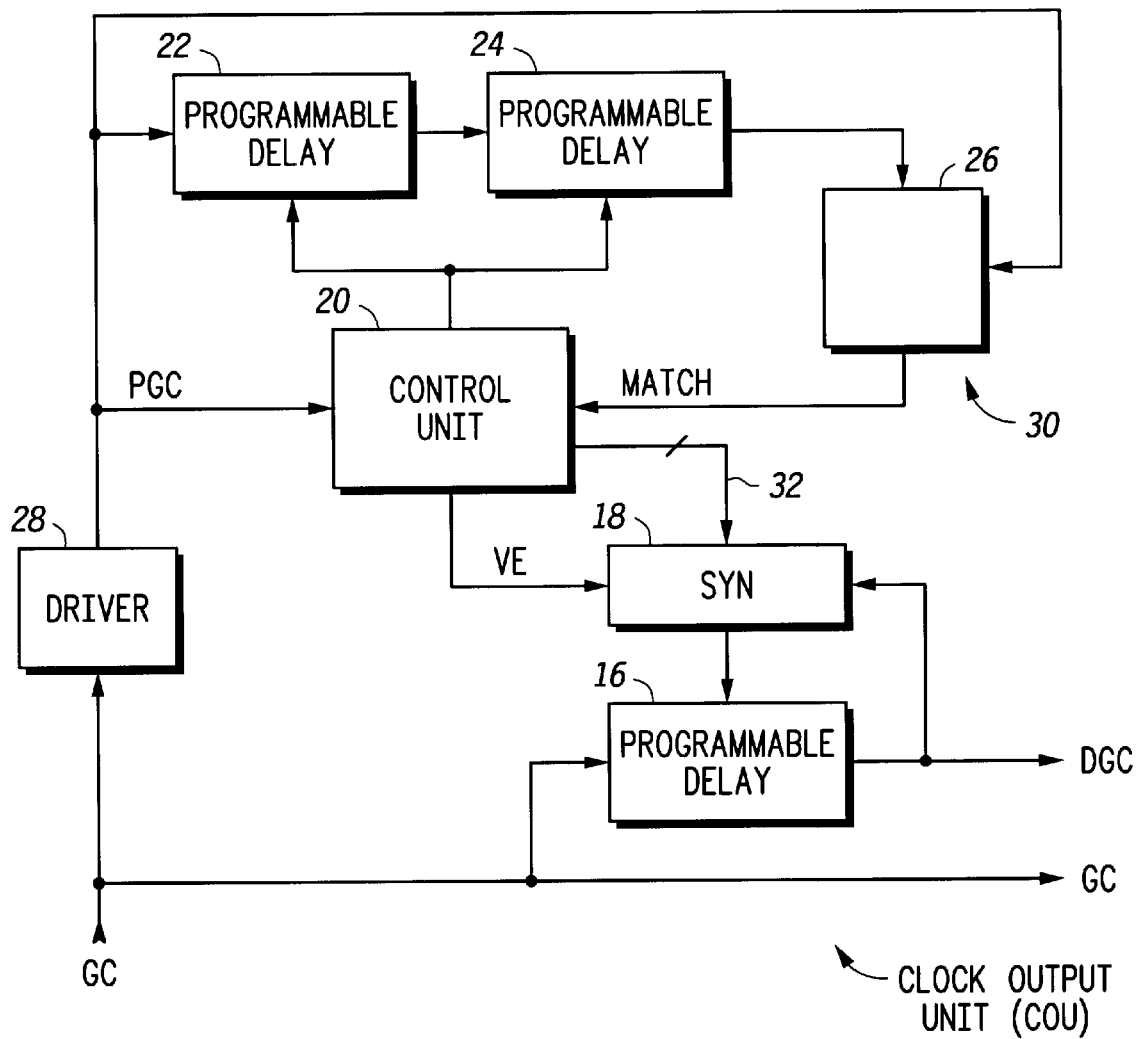
FIG. 3 is a block diagram of a portion of the processing system of FIG. 1 in more detail.

Shown in FIG. 3 is programmable delay 16 and a control portion 30 of processor 12. Control portion 30 comprises a synchronizer 18, a control unit 20, a programmable delay 22, a programmable delay 24, and a D flip-flop 26. Programmable delays 22 and 24 are the same as programmable delay 16. The delay of programmable delays 22 and 24 is selected by control unit 20. Driver 28, in response to global clock GC, provides a processor global clock PGC, which is in phase with and the same frequency as global clock GC, to an input of control unit 20, an input of programmable delay 22, and a clock input of flip-flop 26. An output of programmable delay 22 is coupled to an input of programmable delay 24. An output of programmable delay 24 is coupled to a D input of D flip-flop 26. Synchronizer 18 is coupled to control unit 20 by an update bus 32 and a update enable signal UE and is coupled to programmable delay 18. Programmable delays 16, 22, and 24 are the same. The don't necessarily have to be the same, but should have the same character in that they should have substantially the same amount of delay for a given programming input.

When programmable delays 22 and 24 are programmed to combine to form a 180 degree delay, that indicates that the delay is set properly because that means that each programmable delay 22 and 24 is at 90 degrees. This programming amount is then known to be the amount needed for programmed delay 16 to provide the desired 90 degree delay. The process begins by programmable delays being programmed to have the minimum delay, in the present embodiment this is 500 picoseconds (ps). The combined delay is coupled to the D input of flip-flop 26. The logic state of the D input is then coupled to the output of the D flip flop at the rising edge of its clock input, which in this case is processor global clock PGC, which can be considered equivalent to the global clock GC. Thus so long as the delay is less than 180 degrees, the logic state being output by flip-flop 26 will be a logic low. As soon as the delay reaches 180 degrees, the output of flip-flop 26 will switch to a logic high at the time that processor global clock PGC switches to a logic high. Control unit 20 increments the delays from the minimum delay until the 180 degree delay has occurred. In this case each increment is 40 picoseconds (ps), but this could be more or less depending on the desired accuracy in obtaining the 90 degree delay for programmable delay 16. Further, instead of simply incrementing the amount of delay to find the 180 degree point, other techniques such as successive approximation may be used.

After control unit 20 has determined the amount of delay necessary to reach the 180 degree mark, which is 90 degrees for each programmable delay, that information is forwarded to synchronizer 18 under the control of the update enable signal UE. Bus 32 may have other uses and carry information not related to updating the delay. Thus, signal UE indicates to synchronizer 18 that the information on bus 32 is valid update information. Synchronizer 18 coordinates the updating of programmable delay 16. Each transition (edge) of global clock GC causes a similar edge, delayed, to occur for delayed global signal DGC. The updating of programmable delay 16 should thus occur after providing the corresponding edge but before receiving the next edge.

Thus, control portion 30 provides for a way of providing clock edges substantially at the 25% and 75% points in cycle without requiring a PLL and the attendant circuitry such as a VCO. This also avoids the need for doubling the frequency. Doubling the speed for a clock can be troublesome in part due to the generally needed current drive due to the distances the clock signal must travel. This technique of partitioning the clock instead of multiplying the frequency can be expanded to include other situations. For example, it may desirable to have the delayed clock be something different than 90%. So it may desirable to have more than two programmable delays in series with the number of programmable delays being an integer multiple of the desired delay different than 2. Also it may be convenient to have detection of a delay other than 180 degrees so that the integer multiple may be different from two for that reason as well.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for generating a delayed clock signal from a master clock signal;
   providing a first programmable delay;
   providing a second programmable delay;
   providing a third programmable delay;
   coupling the master clock signal through the first and second programmable delays;
   altering each of the first and second programmable delays to a first final delay such that the master clock signal is delayed about 180 degrees;
   programming the third programmable delay to the first final delay; and
   coupling the master clock to the third programmable delay to provide the delayed clock signal.

2. The method of claim 1, further comprising:
   changing a frequency of the master clock;
   altering each of the first and second programmable delays to a second final delay such that the master clock signal is delayed about 180 degrees; and
   programming the third programmable delay to the second final delay.

3. The method of claim 2, wherein the first, second, and third programmable delays are the same.

4. The method of claim 3, further comprising;
   providing a memory;
   coupling the master clock to the memory; and
   coupling the delayed clock signal to the memory.

5. The method of claim 4, further comprising;
   in a first portion of a first cycle of the master clock performing a read of the memory responsive to the master clock and the delayed clock; and
   in a second portion of the first cycle, performing a write into the memory responsive to the master clock and the delayed clock.

6. A clock circuit for generating a delayed clock from a master clock, comprising:
   a first programmable delay coupled to the master clock and providing an output;
   a second programmable delay coupled to the output of the first delay and for providing an output clock;
   a third programmable delay coupled to the master clock and for providing the delayed clock;
   a control unit coupled to the first, second, and third delays for programming the first, second, and third delays; and a flip-flop coupled to the output clock, the master clock, and the control unit.

7. The clock circuit of claim 6, further comprising:

a synchronization unit coupled between the control unit and the third programmable delay.

8. The clock circuit of claim 6, wherein the flip-flop is further characterized as being means for indicating when the first and second programmable delays achieve a delay of 180 degrees.

9. The clock circuit of claim 8, further comprising a driver coupled between the first programmable delay and the master clock.

10. The clock circuit of claim 9, wherein the control unit is further characterized as providing a final delay signal to the first and second programmable delays when the flip-flop detects the delay of 180 degrees and as coupling the final delay signal to the third programmable delay in response to the flip-flop indicating the first and second programmable delays achieved the delay of 180 degrees.

11. A processing system responsive to a master clock, comprising:

a memory for receiving the master clock;

a clock programmable delay having an input for receiving the master clock and an output coupled to the memory;

a processor, coupled to the memory and the clock programmable delay, for programming the clock programmable delay to a desired delay and for providing addresses and data to the memory;

wherein the processor further comprises:

programmable delay means, coupled to the master clock, for providing a reference delay;

detection means, coupled to the programmable delay means, for determining when the reference delay is an integer multiple of the desired delay, wherein the integer is greater than one.

12. The processing system of claim 11, wherein the detection means comprises a flip-flop.

13. The processing system of claim 12, wherein the programmable delay means comprises a pair of programmable delays that have the same characteristics as the clock programmable delay.

14. The processing system of claim 13, wherein the pair of programmable delays provide a delay of 180 degrees.

15. The processing system of claim 11, wherein the memory is further characterized as performing a read and write in one cycle of the master clock.

16. A method for generating a delayed clock signal from a master clock signal, comprising:

providing a first programmable delay;

providing a programmable delay means having a number, which is in excess of one, of reference programmable delays;

coupling the master clock signal through the programmable delay means;

altering the delay of each of the reference of programmable delays until a delay is obtained which is substantially an integer multiple of a desired delay and the integer multiple is equal to the number;

programming the first programmable delay to substantially the desired delay; and coupling the master clock to the first programmable delay to provide the delayed clock signal.

17. The method of claim 16, wherein the number is two and the desired delay is 90 degrees.

18. The method of claim 16, wherein the reference programmable delays and the first programmable delay have the same character.

19. The method of claim 16, further comprising detecting that the delay is obtained which is substantially an integer multiple of the desired delay and the integer multiple is equal to the number using a flip-flop.

20. The method of claim 16, further comprising:

providing a memory;

coupling the master clock to the memory; and coupling the delayed clock signal to the memory.

* * * * *